(12) United States Patent
Kim et al.

(10) Patent No.: US 10,601,517 B1
(45) Date of Patent: Mar. 24, 2020

(54) PROBABILISTIC SHAPING ON EIGHT-DIMENSIONAL SUPER-SYMBOLS

(71) Applicant: Fujitsu Limited, Kawasaki-shi, Kanagawa (JP)

(72) Inventors: Inwoong Kim, Allen, TX (US); Sebastiaan Anne René Goossens, Plano, TX (US); Olga I. Vassilieva, Plano, TX (US); Tadashi Ikeuchi, Plano, TX (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 16/254,012

(22) Filed: Jan. 22, 2019

(51) Int. Cl.
*H04B 10/04* (2006.01)
*H04B 10/516* (2013.01)
*H03M 13/00* (2006.01)
*H03M 13/27* (2006.01)
*H04B 10/27* (2013.01)

(52) U.S. Cl.
CPC .... *H04B 10/5161* (2013.01); *H03M 13/2792* (2013.01); *H03M 13/6522* (2013.01); *H04B 10/27* (2013.01)

(58) Field of Classification Search
CPC .... H04B 10/5161; H04B 10/27; H04B 10/25; H04B 10/516; H04B 10/541; H04B 10/5561; H04B 10/50; H04B 14/04; H04L 27/34; H03M 13/1102; H03M 13/2792; H03M 13/6522
USPC ....... 398/185, 183, 186, 189, 190, 191, 193, 398/198
See application file for complete search history.

(56) References Cited

U.S. PATENT DOCUMENTS

| | | | | |
|---|---|---|---|---|
| 5,105,442 A * | 4/1992 | Wei | ...... | H03M 13/35 375/262 |
| 8,121,017 B2 * | 2/2012 | Stadelmeier | ...... | H04N 21/4385 370/203 |
| 8,644,263 B2 * | 2/2014 | Cheng | ...... | H04B 7/0426 370/335 |
| 8,792,322 B2 * | 7/2014 | Stadelmeier | ...... | H04N 21/4385 370/203 |
| 10,326,634 B2 * | 6/2019 | Zhang | ...... | H04B 10/541 |

(Continued)

OTHER PUBLICATIONS

Notice of Allowance for U.S. Appl. No. 16/107,141, dated Apr. 11, 2019; 8 pages.

(Continued)

*Primary Examiner* — Hibret A Woldekidan
(74) *Attorney, Agent, or Firm* — Baker Botts L.L.P.

(57) ABSTRACT

A system and method for probabilistic shaping of an eight-dimensional super-symbol in optical transport networks, including receiving binary data to be transmitted as an optical signal; mapping at least a portion of the binary data to symbols of a M-QAM constellation; generating a first four-dimensional symbol of the M-QAM constellation for a first symbol period, including applying probabilistic shaping to the first four-dimensional symbol; generating a second four-dimensional symbol of the M-QAM constellation for a second symbol period, the second symbol period consecutive to the first symbol period, wherein the first and the second four-dimensional symbols have i) an equal symbol energy and ii) a one-to-one relationship; and time interleaving the first symbol period and the second symbol period to generate an eight-dimensional super-symbol.

12 Claims, 8 Drawing Sheets

(56) References Cited

U.S. PATENT DOCUMENTS

| | | | | |
|---|---|---|---|---|
| 10,389,473 | B1* | 8/2019 | Vassilieva | H04J 14/0267 |
| 10,396,899 | B1* | 8/2019 | Kim | H04B 10/541 |
| 10,411,808 | B2* | 9/2019 | Chien | H04L 25/03834 |
| 2012/0328045 | A1* | 12/2012 | Naguib | H04B 7/0417 |
| | | | | 375/295 |
| 2013/0071119 | A1* | 3/2013 | Liu | H04B 10/25137 |
| | | | | 398/65 |
| 2015/0372766 | A1* | 12/2015 | Yoshida | H04B 10/2507 |
| | | | | 398/193 |
| 2017/0373704 | A1* | 12/2017 | Nakamura | H03M 13/23 |
| 2018/0367246 | A1* | 12/2018 | Kakande | G06N 7/005 |
| 2019/0123945 | A1* | 4/2019 | Ko | H04L 1/0044 |
| 2019/0149390 | A1* | 5/2019 | Torbatian | H04B 10/5161 |
| | | | | 375/298 |
| 2019/0280809 | A1* | 9/2019 | Cho | H04L 1/0041 |

OTHER PUBLICATIONS

Buchali, Fred, et al. "Rate adaptation and reach increase by probabilistically shaped 64-QAM: An experimental demonstration," *Journal of Lightwave Technology* 34.7 (2016): 1599-1609; 11 pages, dated 2016.

Yoshida, Tsuyoshi, et al., "Short-Block-Length Shaping by Simple Mark Ratio Controllers for Granular and Wide-Range Spectral Efficiencies," 43rd European Conference on Optical Communication (ECOC 2017), Gothenburg, Sweden, 3 pages, dated Sep. 2017.

Schulte, Patrick, and Georg Böcherer, "Constant composition distribution matching." *IEEE Transactions on Information Theory* 62.1 (2016): 430-434; 5 pages, dated 2016.

Bocherer, Georg, et al., "High Throughput Probabilistic Shaping with Product Distribution Matching," arXiv:1702.07510 [cs.IT], 9 pages, dated Feb. 24, 2017.

* cited by examiner

PROBABILISTIC SHAPING ON EIGHT-DIMENSIONAL SUPER-SYMBOLS

BACKGROUND

Field of the Disclosure

The present disclosure relates generally to optical communication networks and, more particularly, to probabilistic shaping on eight-dimensional super-symbols of optical communication networks.

Description of the Related Art

Telecommunications systems, cable television systems and data communication networks use optical networks to rapidly convey large amounts of information between remote points. In an optical network, information is conveyed in the form of optical signals through optical fibers. Optical networks may also include various network nodes such as amplifiers, dispersion compensators, multiplexer/demultiplexer filters, wavelength selective switches, couplers, etc. to perform various operations within the network.

SUMMARY

Innovative aspects of the subject matter described in this specification may be embodied in methods for probabilistic shaping of an eight-dimensional super-symbol in optical transport networks, including receiving binary data to be transmitted as an optical signal; mapping at least a portion of the binary data to symbols of a M-QAM constellation; generating a first four-dimensional symbol of the M-QAM constellation for a first symbol period, including applying probabilistic shaping to the first four-dimensional symbol; generating a second four-dimensional symbol of the M-QAM constellation for a second symbol period, the second symbol period consecutive to the first symbol period, wherein the first and the second four-dimensional symbols have i) an equal symbol energy and ii) a one-to-one relationship; time interleaving the first symbol period and the second symbol period to generate an eight-dimensional super-symbol; and transmitting the eight-dimensional super-symbol.

Other embodiments of these aspects include corresponding systems, apparatus, and computer programs, configured to perform the actions of the methods, encoded on computer storage devices.

These and other embodiments may each optionally include one or more of the following features. For instance, generating the second four-dimensional symbol includes identifying, via a look-up table (LUT), multiple four-dimensional symbols of the M-QAM constellation for the second symbol period, wherein each combination of the first four-dimensional symbol and each of identified multiple four-dimensional symbols have i) an equal symbol energy and iii) a one-to-one relationship; and identifying the second four-dimensional symbol from the multiple four-dimensional symbols based on a maximization of Euclidean distance of the eight-dimensional super-symbol. The second four-dimensional symbol included probabilistic shaping based on i) the one-to-one relationship between the first and the second four-dimensional symbol and ii) the probabilistic shaping of the first four-dimensional symbol. Identifying the multiple four-dimensional symbols of the M-QAM constellation for the second symbol period includes concatenating binary bits from the first four-dimensional symbol; converting the concatenation to a decimal super-symbol index; identifying a symbol index that corresponds to the decimal super-symbol index; converting symbols of the symbol index that correspond to the second four-dimensional symbol to binary bits; and interleaving the binary bits of the first and the second four-dimensional symbols. The probabilistic shaping is applied only to the first four-dimensional symbol. Applying a log-likelihood ratio to the eight-dimensional super-symbol.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

For a more complete understanding of the present invention and its features and advantages, reference is now made to the following description, taken in conjunction with the accompanying drawings, in which.

DESCRIPTION OF THE EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

Figure 1:
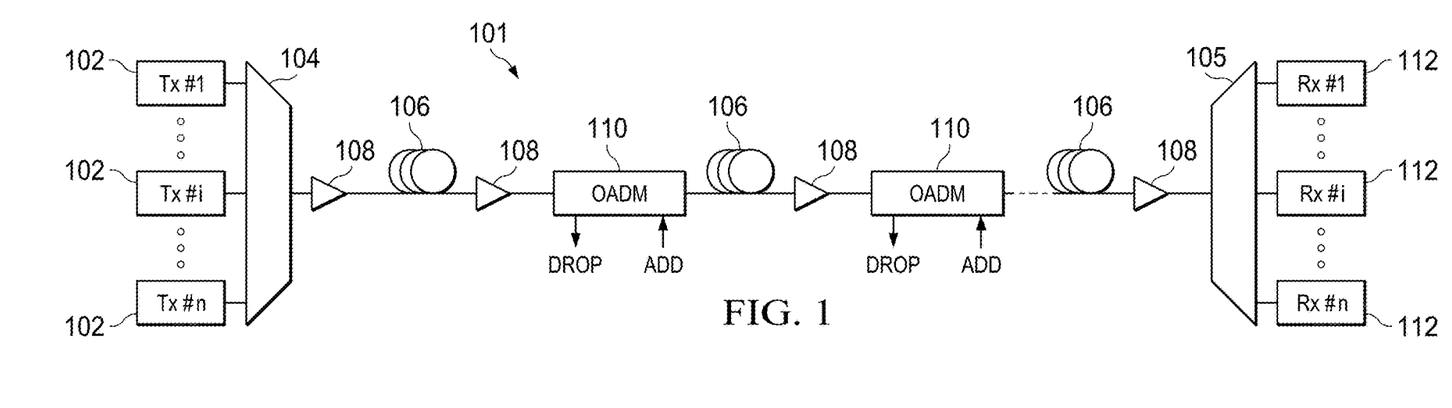
FIG. 1 is a block diagram of selected elements of an embodiment of an optical transport network.

Referring now to the drawings, FIG. 1 illustrates an example embodiment of optical transport network (OTN) 101, which may represent an optical communication system. Optical transport network 101 included one or more optical fibers 106 to transport one or more optical signals communicated by components of optical transport network 101. The network elements of optical transport network 101, coupled together by fibers 106, may comprise one or more transmitters (Tx) 102, one or more multiplexers (MUX) 104, one or more optical amplifiers 108, one or more optical add/drop multiplexers (OADM) 110, one or more demultiplexers (DEMUX) 105, and one or more receivers (Rx) 112.

Optical transport network 101 may comprise a point-to-point optical network with terminal nodes, a ring optical network, a mesh optical network, or any other suitable optical network or combination of optical networks. Optical transport network 101 may be used in a short-haul metropolitan network, a long-haul inter-city network, or any other suitable network or combination of networks. The capacity of optical transport network 101 may include, for example, 100 Gbit/s, 400 Gbit/s, or 1 Tbit/s. Optical fibers 106 comprise thin strands of glass capable of communicating the signals over long distances with very low loss. Optical fibers 106 may comprise a suitable type of fiber selected from a variety of different fibers for optical transmission. Optical fibers 106 may include any suitable type of fiber, such as a standard Single-Mode Fiber (SMF), Enhanced Large Effective Area Fiber (E-LEAF), or TrueWave® Reduced Slope (TW-RS) fiber, among others.

Optical transport network 101 may include devices to transmit optical signals over optical fibers 106. Information may be transmitted and received through optical transport network 101 by modulation of one or more wavelengths of light to encode the information on the wavelength. In optical networking, a wavelength of light may also be referred to as a "channel" that is included in an optical signal. Each channel may carry a certain amount of information through optical transport network 101.

To increase the information capacity and transport capabilities of optical transport network 101, multiple signals transmitted at multiple channels may be combined into a single wide bandwidth optical signal. The process of communicating information at multiple channels is referred to in optics as wavelength division multiplexing (WDM). Coarse wavelength division multiplexing (CWDM) refers to the multiplexing of wavelengths that are widely spaced having low number of channels, usually greater than 20 nm and less than sixteen wavelengths, and dense wavelength division multiplexing (DWDM) refers to the multiplexing of wavelengths that are closely spaced having large number of channels, usually less than 0.8 nm spacing and greater than forty wavelengths, into a fiber. WDM or other multi-wavelength multiplexing transmission techniques are employed in optical networks to increase the aggregate bandwidth per optical fiber. Without WDM, the bandwidth in optical networks may be limited to the bit-rate of solely one wavelength. With more bandwidth, optical networks are capable of transmitting greater amounts of information. Optical transport network 101 may transmit disparate channels using WDM or some other suitable multi-channel multiplexing technique, and to amplify the multi-channel signal.

Recently, advancements in DWDM enabled combining several optical carriers to create a composite optical signal of a desired capacity. One such example of a multi-carrier optical signal is a superchannel, which is an example of high spectral efficiency (SE) that may attain transmission rates of 100 Gb/s, 400 Gb/s, 1 Tb/s, or higher. Thus, in a superchannel, subcarriers are tightly packed and consume less optical spectrum than in conventional DWDM. Another distinctive feature of superchannels is that the subcarriers in a superchannel travel from the same origin to the same destination, and are not added or removed using an OADM while in transmission. Techniques for achieving high spectral efficiency (SE) in optical networks may include the use of superchannels modulated using dual-polarization quadrature phase-shift keying (DP-QPSK) for long-haul transmission at data rates of 100 Gb/s or greater. In particular embodiments, Nyquist wavelength-division multiplexing (N-WDM) may be used in a superchannel. In N-WDM, optical pulses having a nearly rectangular spectrum are packed together in the frequency domain with a bandwidth approaching the baud rate.

Optical transport network 101 may include one or more optical transmitters (Tx) 102 to transmit optical signals through optical transport network 101 in specific wavelengths or channels. Transmitters 102 may comprise a system, apparatus or device to convert an electrical signal into an optical signal and transmit the optical signal. For example, transmitters 102 may each comprise a laser and a modulator to receive electrical signals and modulate the information contained in the electrical signals onto a beam of light produced by the laser at a particular wavelength, and transmit the beam for carrying the signal throughout optical transport network 101. In some embodiments, optical transmitter 102 may be used to determine the baud rate for the data to be transmitted during the optical modulation. An example of transmitter 102 for applying different baud rates is an adaptive rate transponder. An example of transmitter 102 for applying different modulation formats is a universally programmable transceiver. Additionally, a forward error correction (FEC) module may be included in optical transmitter 102, or may be used in conjunction with optical transmitter 102. The FEC module may process the electrical signal carrying the information or data to be transmitted to include error correction codes. The FEC module at transmitter 102 may also determine a baud rate for sending the data to be transmitted to optical transmitter 102 for optical modulation.

Multiplexer 104 may be coupled to transmitters 102 and may be a system, apparatus or device to combine the signals transmitted by transmitters 102, e.g., at respective individual wavelengths, into a WDM signal.

Optical amplifiers 108 may amplify the multi-channeled signals within optical transport network 101. Optical amplifiers 108 may be positioned before and after certain lengths of fiber 106, which is referred to as "in-line amplification". Optical amplifiers 108 may comprise a system, apparatus, or device to amplify optical signals. For example, optical amplifiers 108 may comprise an optical repeater that amplifies the optical signal. This amplification may be performed with opto-electrical or electro-optical conversion. In some embodiments, optical amplifiers 108 may comprise an optical fiber doped with a rare-earth element to form a doped fiber amplification element. When a signal passes through the fiber, external energy may be applied in the form of a pump signal to excite the atoms of the doped portion of the optical fiber, which increases the intensity of the optical signal. As an example, optical amplifiers 108 may comprise an erbium-doped fiber amplifier (EDFA). However, any other suitable amplifier, such as a semiconductor optical amplifier (SOA), may be used.

OADMs 110 may be coupled to optical transport network 101 via fibers 106. OADMs 110 comprise an add/drop module, which may include a system, apparatus or device to add and drop optical signals (i.e., at individual wavelengths) from fibers 106. After passing through an OADM 110, an optical signal may travel along fibers 106 directly to a destination, or the signal may be passed through one or more additional OADMs 110 and optical amplifiers 108 before reaching a destination. In this manner, OADMs 110 may enable connection of different optical transport network topologies together, such as different rings and different linear spans.

In certain embodiments of optical transport network 101, OADM 110 may represent a reconfigurable OADM (ROADM) that is capable of adding or dropping individual or multiple wavelengths of a WDM signal. The individual or multiple wavelengths may be added or dropped in the optical domain, for example, using a wavelength selective switch (WSS) (not shown) that may be included in a ROADM.

Many existing optical networks are operated at 10 gigabit-per-second (Gbps) or 40 Gbps signal rates with 50 gigahertz (GHz) of channel spacing in accordance with International Telecommunications Union (ITU) standard wavelength grids, also known as fixed-grid spacing, which is compatible with conventional implementations of optical add-drop multiplexers (OADMs) and with conventional implementations of demultiplexers 105. However, as data rates increase to 100 Gbps and beyond, the wider spectrum requirements of such higher data rate signals often require increasing channel spacing. In traditional fixed grid networking systems supporting signals of different rates, the entire network system typically must be operated with the coarsest channel spacing (100 GHz, 200 GHz, etc.) that can accommodate the highest rate signals. This may lead to an over-provisioned channel spectrum for lower-rate signals and lower overall spectrum utilization.

Thus, in certain embodiments, optical transport network 101 may employ components compatible with flexible grid optical networking that enables specifying a particular frequency slot per channel. For example, each wavelength channel of a WDM transmission may be allocated using at least one frequency slot. Accordingly, one frequency slot may be assigned to a wavelength channel whose symbol rate is low, while a plurality of frequency slots may be assigned to a wavelength channel whose symbol rate is high. Thus, in optical transport network 101, ROADM 110 may be capable of adding or dropping individual or multiple wavelengths of a WDM, DWDM, or superchannel signal carrying data channels to be added or dropped in the optical domain. In certain embodiments, ROADM 110 may include or be coupled to a wavelength selective switch (WSS).

As shown in FIG. 1, optical transport network 101 may also include one or more demultiplexers 105 at one or more destinations of network 101. Demultiplexer 105 may comprise a system apparatus or device that acts as a demultiplexer by splitting a single composite WDM signal into individual channels at respective wavelengths. For example, optical transport network 101 may transmit and carry a forty (40) channel DWDM signal.

Demultiplexer 105 may divide the single, forty channel DWDM signal into forty separate signals according to the forty different channels. It will be understood that different numbers of channels or subcarriers may be transmitted and demultiplexed in optical transport network 101, in various embodiments.

In FIG. 1, optical transport network 101 may also include receivers 112 coupled to demultiplexer 105. Each receiver 112 may receive optical signals transmitted at a particular wavelength or channel, and may process the optical signals to obtain (demodulate) the information (data) that the optical signals contain. Accordingly, network 101 may include at least one receiver 112 for every channel of the network. As shown, receivers 112 may demodulate the optical signals according to a baud rate used by transmitter 102. In some embodiments, receiver 112 may include, or may be followed by, a forward error correction (FEC) module to use the error correction codes to check the integrity of the received data. The FEC module may also correct certain errors in the data based on the error correction codes. The FEC module at receiver 112 may also demodulate the data at a specific baud rate defined for each channel at transmitter 102, as described above.

Optical networks, such as optical transport network 101 in FIG. 1, may employ modulation techniques to convey information in the optical signals over the optical fibers. Such modulation schemes may include phase-shift keying (PSK), frequency-shift keying (FSK), amplitude-shift keying (ASK), and quadrature amplitude modulation (QAM), among other examples of modulation techniques. In PSK, the information carried by the optical signal may be conveyed by modulating the phase of a reference signal, also known as a carrier wave, or simply, a carrier. The information may be conveyed by modulating the phase of the signal itself using two-level or binary phase-shift keying (BPSK), four-level or quadrature phase-shift keying (QPSK), multi-level phase-shift keying (M-PSK) and differential phase-shift keying (DPSK). In QAM, the information carried by the optical signal may be conveyed by modulating both the amplitude and phase of the carrier wave. PSK may be considered a subset of QAM, wherein the amplitude of the carrier waves is maintained as a constant.

PSK and QAM signals may be represented using a complex plane with real and imaginary axes on a constellation diagram. The points on the constellation diagram representing symbols carrying information may be positioned with uniform angular spacing around the origin of the diagram. The number of symbols to be modulated using PSK and QAM may be increased and thus increase the information that can be carried. The number of signals may be given in multiples of two. As additional symbols are added, they may be arranged in uniform fashion around the origin. PSK signals may include such an arrangement in a circle on the constellation diagram, meaning that PSK signals have constant power for all symbols. QAM signals may have the same angular arrangement as that of PSK signals, but include different amplitude arrangements. QAM signals may have their symbols arranged around multiple circles, meaning that the QAM signals include different power for different symbols. This arrangement may decrease the risk of noise as the symbols are separated by as much distance as possible. A number of symbols "m" may thus be used and denoted "m-PSK" or "M-QAM."

Examples of PSK and QAM with a different number of symbols can include binary PSK (BPSK or 2-PSK) using two phases at 0° and 180° (or in radians, 0 and π) on the constellation diagram; or quadrature PSK (QPSK, 4-PSK, or 4-QAM) using four phases at 0°, 90°, 180°, and 270° (or in radians, 0, π/2, π, and 3π/2). Phases in such signals may be offset. Each of 2-PSK and 4-PSK signals may be arranged on the constellation diagram. Certain m-PSK signals may also be polarized using techniques such as dual-polarization QPSK (DP-QPSK), wherein separate m-PSK signals are multiplexed by orthogonally polarizing the signals. Also, M-QAM signals may be polarized using techniques such as dual-polarization 16-QAM (DP-16-QAM), wherein separate M-QAM signals are multiplexed by orthogonally polarizing the signals.

Dual polarization technology, which may also be referred to as polarization division multiplexing (PDM), enables achieving a greater bit rate for information transmission. PDM transmission comprises simultaneously modulating information onto various polarization components of an optical signal associated with a channel, thereby nominally increasing the transmission rate by a factor of the number of polarization components. The polarization of an optical signal may refer to the direction of the oscillations of the optical signal. The term "polarization" may generally refer to the path traced out by the tip of the electric field vector at a point in space, which is perpendicular to the propagation direction of the optical signal.

In certain embodiments, optical transport network 101 may transmit a superchannel, in which a plurality of subcarriers (or subchannels or channels) are densely packed in a fixed bandwidth band and may be transmitted at very high data rates, such as 400 Gb/s, 1 Tb/s, or higher. Furthermore, the superchannel may be well suited for transmission over very long distances, such as hundreds of kilometers, for example. A typical superchannel may comprise a set of subcarriers that are frequency multiplexed to form a single channel that are transmitted through optical transport network 101 as one entity. The subcarriers within the superchannel may be tightly packed to achieve high spectral efficiency.

In an optical network, such as optical transport network 101 in FIG. 1, it is typical to refer to a management plane, a control plane, and a transport plane (sometimes called the physical layer). A central management host (see also FIG. 3) may reside in the management plane and may configure and supervise the components of the control plane. The management plane includes ultimate control over all transport plane and control plane entities (e.g., network elements). As an example, the management plane may consist of a central processing center (e.g., the central management host), including one or more processing resources, data storage components, etc. The management plane may be in electrical communication with the elements of the control plane and may also be in electrical communication with one or more network elements of the transport plane. The management plane may perform management functions for an overall system and provide coordination between network elements, the control plane, and the transport plane. As examples, the management plane may include an element management system (EMS) which handles one or more network elements from the perspective of the elements, a network management system (NMS) which handles many devices from the perspective of the network, or an operational support system (OSS) which handles network-wide operations.

Modifications, additions or omissions may be made to optical transport network 101 without departing from the scope of the disclosure. For example, optical transport network 101 may include more or fewer elements than those depicted in FIG. 1. Also, as mentioned above, although depicted as a point-to-point network, optical transport network 101 may comprise any suitable network topology for transmitting optical signals such as a ring, a mesh, or a hierarchical network topology.

In operation, optical transport network 101 represents a certain transmission capacity for data. As the demand for transmission capacity continues to increase, various methods may be employed to accommodate greater transmission capacity on optical transport network 101. For example, advanced modulation formats, such as 16-QAM or 64-QAM, may be used to increase transmission capacity per wavelength channel. The advanced modulation formats may be applied using transmitter 102 and receiver 112. However, the use of higher order modulation formats may result in decreased transmission reach (also referred to simply as 'reach') of the optical signal. For example, the reach may be determined by an acceptable value for bit error rate (BER), and accordingly OSNR, which may be observed at receivers 112.

Another strategy for increasing transmission capacity is the use of a superchannel, in which a plurality of subcarrier signals are densely packed in a fixed bandwidth band and may be transmitted at very high data rates, such as 400 Gb/s, 1 Tb/s, or higher. As noted above, optical superchannels may represent a promising solution for transmission of signals at 400 Gb/s and 1 Tb/s data rate per channel. However, as noted above, superchannels are typically used with flexible grid network components, which may not be universally available. Also, administration of superchannels may be associated with additional layers of network management, which may be undesirable in certain networks. While the use of superchannels typically enables an increase in transmission capacity, superchannels do not extend the transmission reach of optical signals using optical transport network 101.

In operation of optical transport network 101, in order to extend the transmission reach of certain optical signals, such as high capacity optical signals modulated using an advanced modulation format, constellation shaping may be applied to the optical signals. In constellation shaping, data bits are mapped and coded into improved constellations that may exhibit improved noise tolerance or increased OSNR. As a result of the improved noise tolerance, the reach of an optical signal in which constellation shaping has been applied may be increased, which is desirable for optical communication using optical transport network 101. In a typical modulation format (such as QPSK or M-QAM), the symbols exhibit a uniform distribution in the complex plane, shown as uniformly distribution constellation points in a constellation diagram. When constellation shaping is applied to a modulation formation, the distribution of the symbols in the complex plane is changed to provide an improved mapping for noise tolerance. In some instances, the distribution of symbols may be a Gaussian or Gaussian-like distribution that is shown as non-uniform constellation points in the constellation diagram.

As noted above, transmitter 102 may be a universally programmable transceiver for applying different modulation formats, while receiver 112 may include the corresponding functionality for demodulation. Thus, transmitter 102 may support the use of constellation shaping and may be selectively programmed to apply constellation shaping on a per channel basis, while receiver 112 may correspondingly demodulate channels to which a certain kind of constellation shaping has been applied. In various embodiments, transmitter 102 and receiver 112 may include respective mapping/de-mapping functionality, such as within a digital signal processing (DSP) module, to enable implementation of constellation shaping in optical transport network 101.

Probabilistic shaping (PS) based on M-QAM has been studied as a way to control spectral efficiency with finer granularity and to achieve an improved performance closer to Shannon capacity limit. In one example, PS-M-QAM may be implemented using constant composition distribution matching (CCDM). Performing probabilistic shaping based on M-QAM may improve utilization of network resource. In some cases, the shaped profile follows a Maxwell-Boltzmann distribution. Using existing methods, the minimum entropy of probabilistic shaping based on M-QAM is 2 bits/symbol, which corresponds to QPSK, where entropy, as a measure of information, is defined as the number of bits of information contained in each message or symbol, where channel noise is not considered.

In optical transport network 101, constellation shaping may be activated/deactivated as a procedure in network operations on a per channel basis for a given optical path. In this manner, the available spectrum may be flexibly allocated in terms of bandwidth and constellation shaping to meet various traffic demands, based on specific path information (distance, number/type of co-propagating channels, fiber type, and dispersion map), which may be economically desirable. Furthermore, constellation shaping using universal programmable transceivers in optical transport network 101 may provide improvements in reach with the same electronics and optical components that are already available and installed, which may enable a rapid upgrade to implement constellation shaping.

As noted above, entropy may be defined as the number of bits of information contained in each message or symbol. Entropy may be calculated using the following equation:

$$H(X) = -\Sigma_i P(x_i) \log_2 P(x_i) \quad \text{Equation (2)}$$

In Equation 1, X is a discrete random variable with M possible symbols $\{x_1, x_2, \ldots x_M\}$, and P(X) is a probability mass function representing the probability of each symbol assigned. For a uniform distribution, Equation 2 becomes:

$$H(X) = -\sum_{i=1}^{M} \frac{1}{M} \log_2 \frac{1}{M} \quad \text{Equation (3)}$$

or $$\log_2 M = m (\text{bits/symbol}) \quad \text{Equation (4)}$$

Figure 2A:
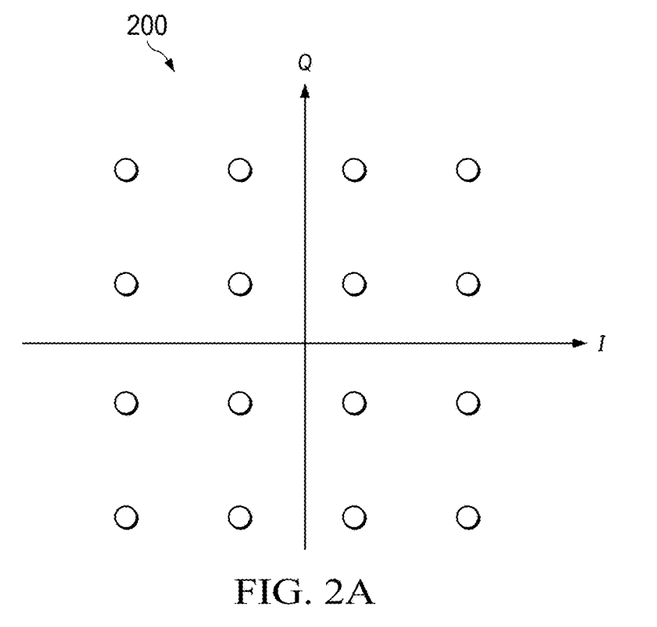
FIG. 2A illustrates selected elements of an embodiment of a constellation diagram in the complex plane.
Figure 2B:
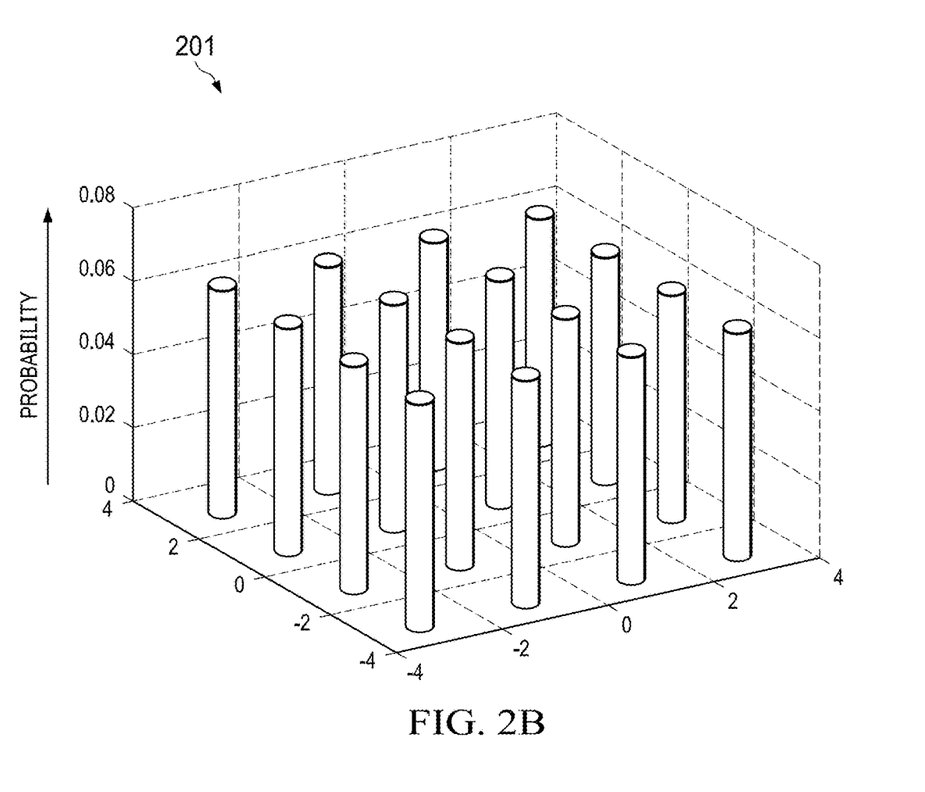
FIG. 2B illustrates selected elements of an embodiment of a probability distribution diagram corresponding to the constellation diagram illustrated in FIG. 2A.

FIG. 2A illustrates selected elements of an embodiment of a constellation diagram 200 in the complex plane for 16-QAM. In constellation diagram 200, a 16-QAM constellation is shown having a uniform distribution of the 16 constellation points. In this example, for 16-QAM with a uniform distribution, there would be 16 different symbols, each having a probability of $1/16^{th}$. FIG. 2B illustrates selected elements of an embodiment of a probability distribution diagram 201 corresponding to the constellation diagram 200 illustrated in FIG. 2A. The height of each column represents a probability value for a symbol in a corresponding position in constellation diagram 200. In this example, the probability of each symbol assigned is $1/16$ or 0.0625. Plugging the probability $P=1/16$ into Equation 2 above, plugging M=16 into Equation 3 above, or plugging M=16 into Equation 4, as shown below, yields an entropy of four bits per symbol.

$$\log_2 16 = 4 (\text{bits/symbol})$$

As will be described in further detail herein, methods and systems are disclosed for probabilistic shaping of an eight-dimensional super-symbol in an optical network, such as optical transport network 101. Applying probabilistic shaping of an eight-dimensional super-symbol may allow an optical transport network to achieve lower entropy for long distance transmission (e.g., entropy above 1 bit/symbol per polarization). In one example, with probabilistic shaping of an eight-dimensional super-symbol, the entropy may be controlled to be between 1 bit/symbol and 2 bits/symbol per polarization.

Figure 3:
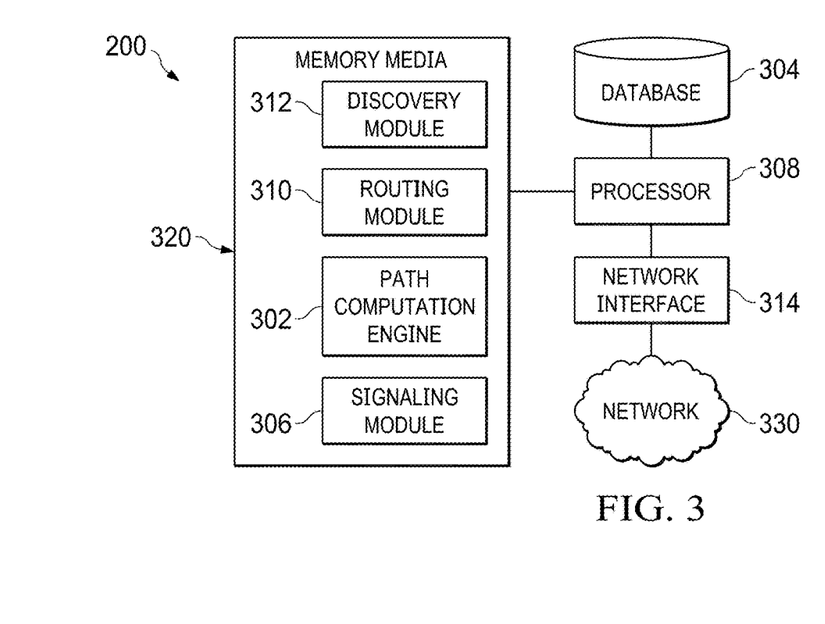
FIG. 3 is a block diagram of selected elements of an embodiment of a network management system for implementing control plane functionality in optical networks.

Referring now to FIG. 3, a block diagram of selected elements of an embodiment of network management system 300 for implementing control plane functionality in optical networks, such as, for example, in optical transport network 101 (see FIG. 1), is illustrated. A control plane may include functionality for network intelligence and control and may comprise applications that support the ability to establish network services, including applications or modules for discovery, routing, path computation, and signaling, as will be described in further detail. The control plane applications executed by network management system 300 may work together to automatically establish services within the optical network. Discovery module 312 may discover local links connecting to neighbors. Routing module 310 may broadcast local link information to optical network nodes while populating database 304. When a request for service from the optical network is received, path computation engine 302 may be called to compute a network path using database 304. This network path may then be provided to signaling module 306 to establish the requested service.

As shown in FIG. 3, network management system 300 includes processor 308 and memory media 320, which may store executable instructions (i.e., executable code) that may be executable by processor 308, which has access to memory media 320. Processor 308 may execute instructions that cause network management system 300 to perform the functions and operations described herein. For the purposes of this disclosure, memory media 320 may include non-transitory computer-readable media that stores data and instructions for at least a period of time. Memory media 320 may comprise persistent and volatile media, fixed and removable media, and magnetic and semiconductor media. Memory media 320 may include, without limitation, storage media such as a direct access storage device (e.g., a hard disk drive or floppy disk), a sequential access storage device (e.g., a tape disk drive), compact disk (CD), random access memory (RAM), read-only memory (ROM), CD-ROM, digital versatile disc (DVD), electrically erasable programmable read-only memory (EEPROM), and flash memory; non-transitory media, or various combinations of the foregoing. Memory media 320 is operable to store instructions, data, or both. Memory media 320 as shown includes sets or sequences of instructions that may represent executable computer programs, namely, path computation engine 302, signaling module 306, discovery module 312 and routing module 310.

Also shown included with network management system 300 in FIG. 3 is network interface 314, which may be a suitable system, apparatus, or device operable to serve as an interface between processor 308 and network 330. Network interface 314 may enable network management system 300 to communicate over network 330 using a suitable transmission protocol or standard. In some embodiments, network interface 314 may be communicatively coupled via network 330 to a network storage resource. In some embodiments, network 330 represents at least certain portions of optical transport network 101. In certain embodiments, network 330 may include at least certain portions of a public network, such as the Internet. Network 330 may be implemented using hardware, software, or various combinations thereof.

In certain embodiments, the control plane may be configured to interface with a person (i.e., a user) and receive data about the signal transmission path. For example, the control plane may also include and/or may be coupled to one or more input devices or output devices to facilitate receiving data about the signal transmission path from the user and outputting results to the user. The one or more input and output devices (not shown) may include, but are not limited to, a keyboard, a mouse, a touchpad, a microphone, a display, a touchscreen display, an audio speaker, or the like.

Alternately or additionally, the control plane may be configured to receive data about the signal transmission path from a device such as another computing device or a network element (not shown in FIG. 3), for example via network 330.

As shown in FIG. 3, in some embodiments, discovery module 312 may be configured to receive data concerning an optical signal transmission path in an optical network and may be responsible for discovery of neighbors and links between neighbors. In other words, discovery module 312 may send discovery messages according to a discovery protocol, and may receive data about the optical signal transmission path. In some embodiments, discovery module 312 may determine features, such as, but not limited to: fiber type, fiber length, number and type of components, data rate, modulation format of the data, input power of the optical signal, number of signal carrying wavelengths (i.e., channels), channel spacing, traffic demand, and network topology, among others.

As shown in FIG. 3, routing module 310 may be responsible for propagating link connectivity information to various nodes within an optical network, such as optical transport network 101. In particular embodiments, routing module 310 may populate database 304 with resource information to support traffic engineering, which may include link bandwidth availability. Accordingly, database 304 may be populated by routing module 310 with information usable to determine a network topology of an optical network.

Path computation engine 302 may be configured to use the information provided by routing module 310 to database 304 to determine transmission characteristics of the optical signal transmission path. The transmission characteristics of the optical signal transmission path may provide insight on how transmission degradation factors, such as chromatic dispersion (CD), nonlinear (NL) effects, polarization effects, such as polarization mode dispersion (PMD) and polarization dependent loss (PDL), and amplified spontaneous emission (ASE), among others, may affect optical signals within the optical signal transmission path. To determine the transmission characteristics of the optical signal transmission path, path computation engine 302 may consider the interplay between the transmission degradation factors. In various embodiments, path computation engine 302 may generate values for specific transmission degradation factors. Path computation engine 302 may further store data describing the optical signal transmission path in database 304.

In FIG. 3, signaling module 306 may provide functionality associated with setting up, modifying, and tearing down end-to-end networks services in optical transport network 101. For example, when an ingress node in the optical network receives a service request, the control plane may employ signaling module 306 to request a network path from path computation engine 302 that may be optimized according to different criteria, such as bandwidth, cost, etc. When the desired network path is identified, signaling module 306 may then communicate with respective nodes along the network path to establish the requested network services. In different embodiments, signaling module 306 may employ a signaling protocol to propagate subsequent communication to and from nodes along the network path.

In operation of network management system 300, path computation engine 302, or another entity or module, may provide path information associated with a given optical path, such as a distance, a number and type of optical channels to be transmitted, a fiber type, and a dispersion map. For example, signaling module 306, or another entity or module, may receive the path information and may decide on a type of modulation format and whether or not to use constellation shaping (and, if so, whether or not to apply set partitioning and shaping parameters) for any of the optical channels transmitted over the optical path. In order to activate or deactivate constellation shaping, with or without set partitioning, signaling module 306 may send a first command to each transmitter for each of the optical channels, respectively. Then, signaling module 306 may send a second command to each receiver corresponding to each transmitter to activate or deactivate constellation shaping. Transmitters and receivers having universal programmable transponder functionality may receive the commands from signaling module 306 and may then activate or deactivate transmission of the optical channels using constellation shaping.

Figure 4:
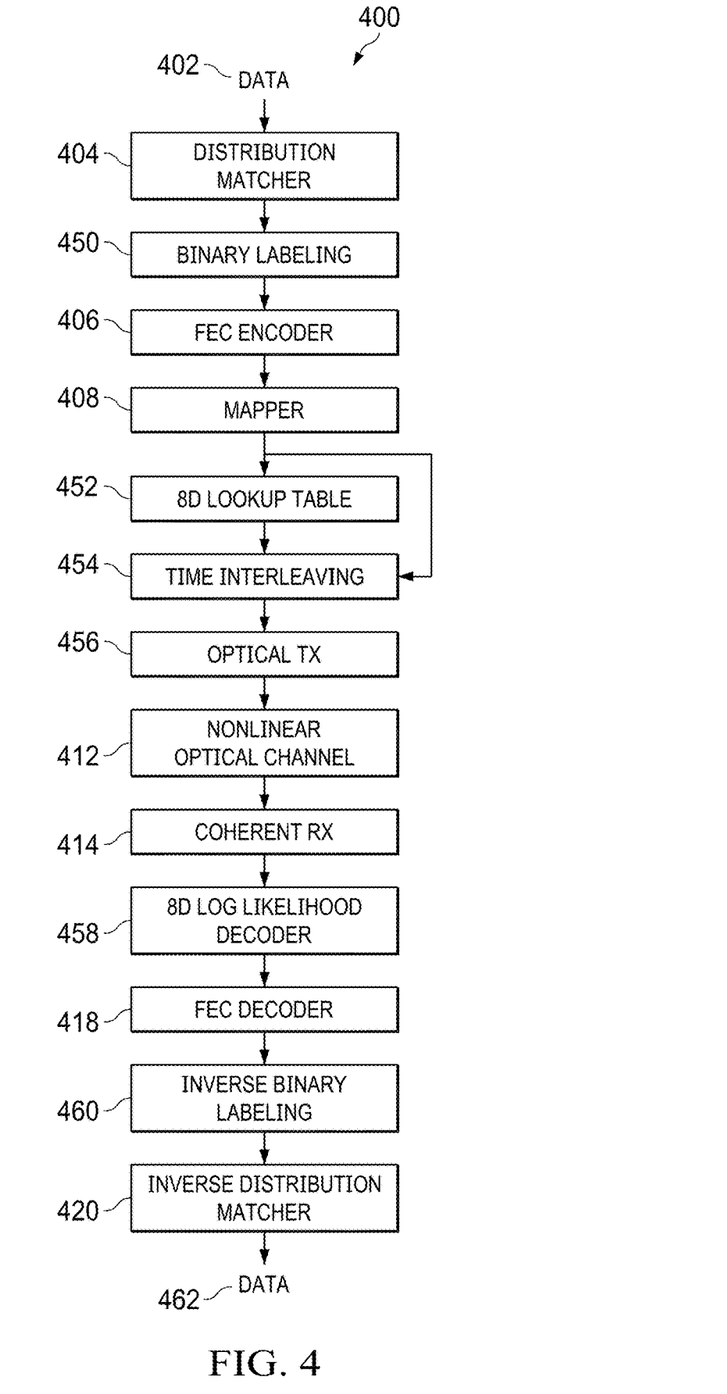
FIG. 4 is a block diagram of selected elements of an embodiment of a network management system for probabilistic shaping of an eight-dimensional super-symbol in an optical network.

FIG. 4 is a schematic diagram illustrating selected elements of an example embodiment of an optical transmission system 400 configured for probabilistic shaping of an eight-dimensional super-symbol in an optical network. As illustrated in this example, in some embodiments, transmission system 400 includes elements such as binary data 402 that is provided to optical transmission system 400 for transmission, a distribution matcher 404, a binary labeling module 450, a forward error correction (FEC) encoder 406, a mapper 408, a look-up table (LUT) 452, and a time interleaving module 454. The system 400 can further include an optical transmitter 456, a nonlinear optical channel 412, a coherent receiver 414, a log-likelihood decoder 458, a FEC decoder 418, an inverse binary labeling module 460, and an inverse distribution matcher 420.

In the illustrated embodiment, matcher 404 receives the binary data 402 and generates data that is modified to achieve a particular probability profile based on, for example, a target probability distribution. Following matcher 404, FEC encoder 406 and symbol mapper 408 may add forward error correcting encodings and map portions of binary data 402 (now with probabilities shaped by matcher 404) to respective symbols before providing outputs to LUT module 452 and time interleaving module 454. In the illustrated embodiment, the optical transmitter 456 can transmit to the coherent receiver 414 the modified and mapped portions of binary data 402 over the optical channel. Subsequently, this binary data may be processed by FEC decoder 418 and inverse distribution matcher 420 to recover the originally received binary data 402.

In one example, probabilistic constellation shaping may be applied in a transponder configured to transmit an optical signal using 64 QAM. By apply probabilistic shaping, the spectral efficiency can vary from 64 QAM to QPSK (e.g., from 6 bits per symbol per polarization to 2 bits per symbol per polarization) with very fine tuning. In some embodiments, the spectral efficiency may be varied in increments of less than one bit per symbol. For example, instead of the spectral efficiency being configurable with values of just 6 or 5 bits per symbol, the spectral efficiency may be configurable with values of 5.1, 5.5, or 5.9 bits per symbol, as an example. In some embodiments, using distribution matcher 404 and inverse distribution matcher 420, one transponder may be able to cover the whole range of spectral efficiency between 2 bits per symbol and 6 bits per symbol.

Further, the mapper 408 can generate a first four-dimensional symbol, with the LUT module 452 generating a second four-dimensional symbol based on the input of the first four-dimensional symbol, described further herein. The time interleaving module 454 can then time interleave two consecutive time periods that include the four-dimensional signals to generate an eight-dimensional super-symbol, which is transmitted over the optical channel.

Figure 5:
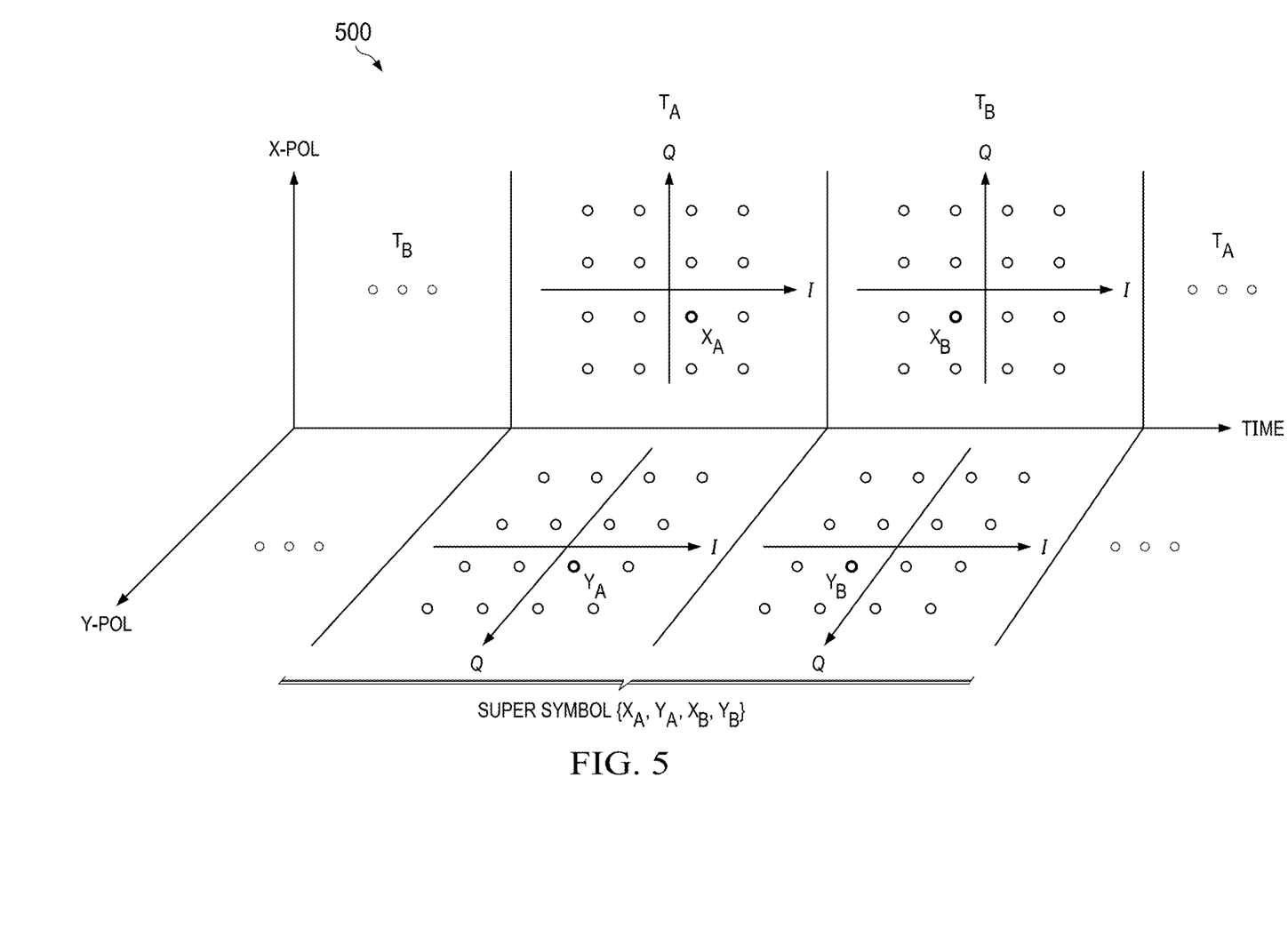
FIG. 5 illustrates an eight-dimensional super-symbol M-QAM constellation.

To that end, the system 400 can be utilized for combining probabilistic shaping with an eight-dimensional super-symbol. Specifically, FIG. 5 illustrates an eight-dimensional super-symbol M-QAM constellation (DP-16-QAM) 500. The eight-dimensional super-symbol can be characterized by the I/Q axis in the complex plane, the x-polarization plane, the y-polarization plane, and the symbol period (or time slot, time period). Thus, multiplying each of these dimensions results in an eight-dimensional super-symbol. In the illustrated example, the eight-dimensional super-symbol can include the symbols, or four constellation points, $X_A$, $Y_A$, $X_B$, $Y_B$.

The system 400 can generate a first four-dimensional symbol of the M-QAM constellation for a first symbol period $T_A$. In the illustrated example, the first four-dimensional symbol can include the $X_A$, $Y_A$ constellation points for the symbol period $T_A$. Furthermore, the system 400 can be configured to implement probabilistic shaping for the first symbol period $T_A$, and the first four-dimensional symbol. In some examples, the probabilistic shaping is only applied to the first four-dimensional symbol constellation points, e.g., $X_A$ and $Y_A$.

The system 400 can generate a second four-dimensional symbol of the M-QAM constellation for a second symbol period $T_B$. In the illustrated example, the second four-dimensional symbol can include the $X_B$, $Y_B$ constellation points for the symbol period $T_B$. In some examples, the period $T_B$ is consecutive to the period $T_A$. Furthermore, the second four-dimensional symbol can be selected such that the first four-dimensional symbol (e.g., $X_A$, $Y_A$) and the second four-dimensional symbol ($X_B$, $Y_B$) have equal symbol energy and a one-to-one relationship for probabilistic shaping. To that end, the second four-dimensional symbol can be implemented using the LUT module 452. Specifically, there can be multiple combinations of the constellation symbols for the period $T_B$ for the second four-dimensional symbol.

Figure 9:
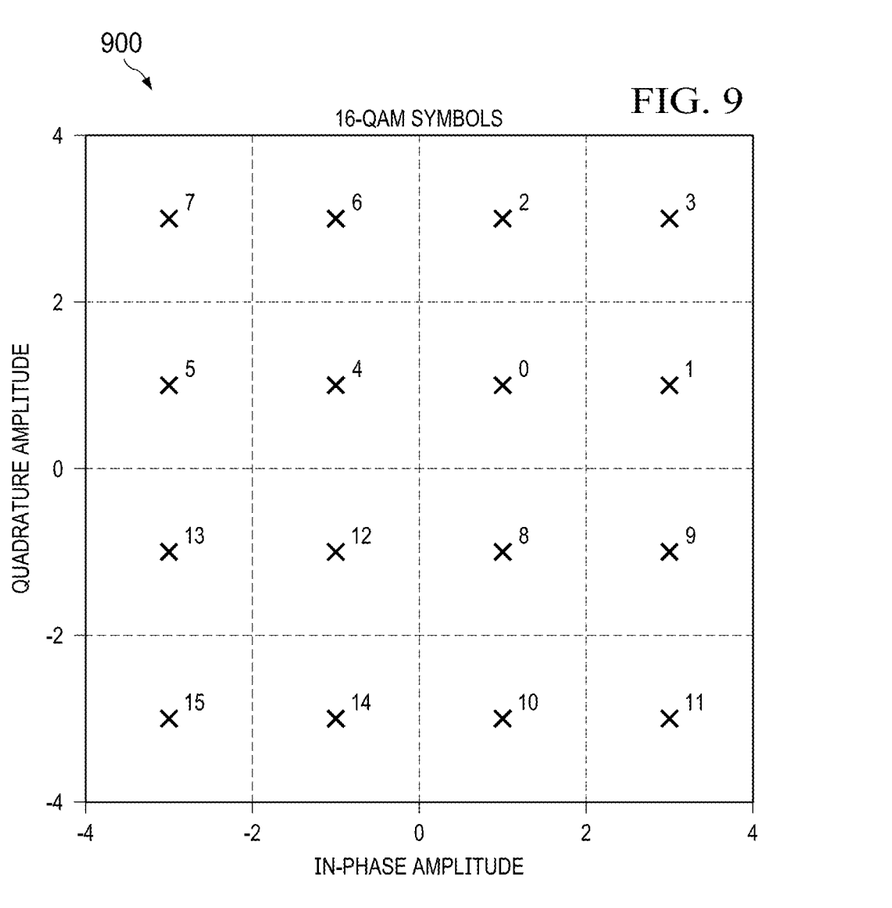
FIG. 9 illustrates symbols of a constellation diagram in the complex plane for 16-QAM.

In some examples, generating the second four-dimensional symbol can include identifying, via the LUT module 452, multiple four-dimensional symbols of the M-QAM constellation. Each combination of the first four-dimensional symbol (e.g., $X_A$, $Y_A$) and the multiple four-dimensional symbols can have an equal symbol energy and a one-to-one-relationship between the respective symbols. FIG. 9 illustrates symbols of a constellation diagram 900 in the complex plane for 16-QAM. Continuing the example, a sample look-up table (e.g., LUT module 452) for a 16-QAM based on the constellation diagram 900, is provided as Table 1:

TABLE 1

Sample lookup table for 16-qam

| $T_A$ $_bX_A \, _bY_A$ | supersymbol index | symbol index $S_{X_A}$ | $S_{Y_A}$ | $S_{X_B}$ | $S_{Y_B}$ | $T_B$ $_bX_B \, _bY_B$ |
|---|---|---|---|---|---|---|
| 0000 0000 | 0 | 0 | 0 | 8 | 4 | 1000 0010 |
| 0000 1101 | 13 | 0 | 13 | 2 | 0 | 0010 0000 |
| 0011 0111 | 55 | 3 | 7 | 7 | 3 | 0111 0011 |
| 1111 1100 | 252 | 15 | 12 | 4 | 11 | 0100 1011 |

To that end, input bits of the constellation symbols of the first four-dimensional symbol (e.g., $X_A$, $Y_A$) can be translated via the LUT, where each index corresponds to constellation symbol pairs. In the example of Table 1, 16-QAM has symbol indices of 0-15 and the eight-dimensional super-symbol can have indices 0-255. Continuing the example, identifying the multiple four-dimensional symbols of the M-QAM constellation for the second four-dimensional symbol can include concatenating binary bits from the first four-dimensional symbol. For example, input bits from $X_A$ (1111) and $Y_A$ (1100) are concatenated (1111 1100). Further, the concatenation is converted to a decimal super-symbol index. For example, the concatenation (1111 1100) is converted to 252 per the symbol index of Table 1. A symbol index is identified that corresponds to the decimal super-symbol index. For example, the super-symbol index of Table 1 defines a row of numbers in a lookup table entry for $T_A$ and $T_B$. Table 1 can define relationship between periods $T_A$ and $T_B$, e.g., 15, 12 and 4, 11. The symbols of the symbol index are converted to binary bits. For example, symbols Xs and Ys are chosen and converted back to binary bits, e.g., 4, 11 are converted to 0100, 1011.

Figure 6:
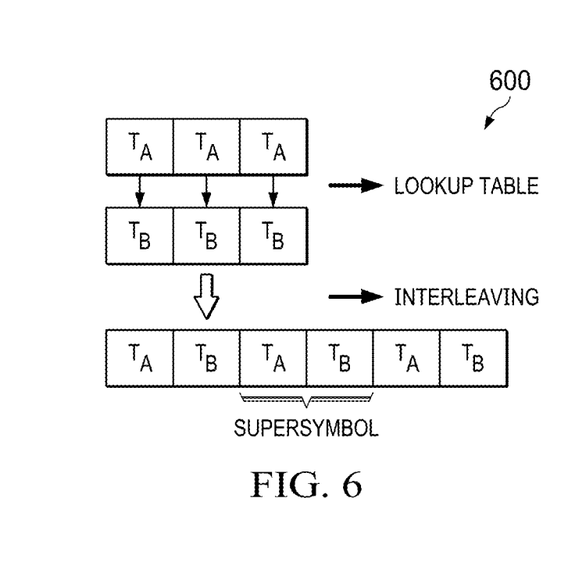
FIG. 6 illustrates a first symbol period and a second symbol period that are time interleaved.

In some implementations, the first symbol period and the second symbol period can be time interleaved, e.g., by the time interleaving module 454, to generate the eight-dimensional super-symbol, as shown by example 600 in FIG. 6. In some examples, time interleaving the first symbol period and the second symbol period can include interleaving the binary bits of the first and the second four-dimensional symbols. For example, blocks of bits for $T_A$ and $T_B$ are interleaved and transmitted as a super-symbol (e.g., 1111 1100 0100 1011).

In some further examples, as mentioned previously, there can be multiple possible solutions that exist between symbol periods $T_A$ and $T_B$ which satisfy equal power between respective four-dimensional symbols. For example, for DP-16-QAM, there are multiple choices of period $T_B$ for each period $T_A$ (and respective four-dimensional symbols of each $T_B$). To that end, the second four-dimensional symbol can be chosen based on a maximization of Euclidean distance of the eight-dimensional super-symbol. Maximization of the Euclidean distance can improve signal-to-noise ratio (SNR) of the system 400. In some examples, to maximize the Euclidean distance, low amplitude symbols (low energy) are prioritized for one-to-one pairing between the first and the second four-dimensional symbols.

Furthermore, as mentioned previous, period $T_A$ and period $T_B$ can have the same symbol energy. Also, as mentioned previous, probabilistic shaping can be applied to the first four-dimensional symbol of period $T_A$. To that end, the second four-dimensional symbol of period $T_B$ can include probabilistic shaping based on i) the one-to-one relationship between the first and the second four-dimensional symbols and ii) the probabilistic shaping of the first four-dimensional symbol. In some examples, the second four-dimensional symbol of period $T_B$ can include probabilistic shaping based on the equal symbol energy to the first four-dimensional symbol of period $T_A$.

Figure 7:
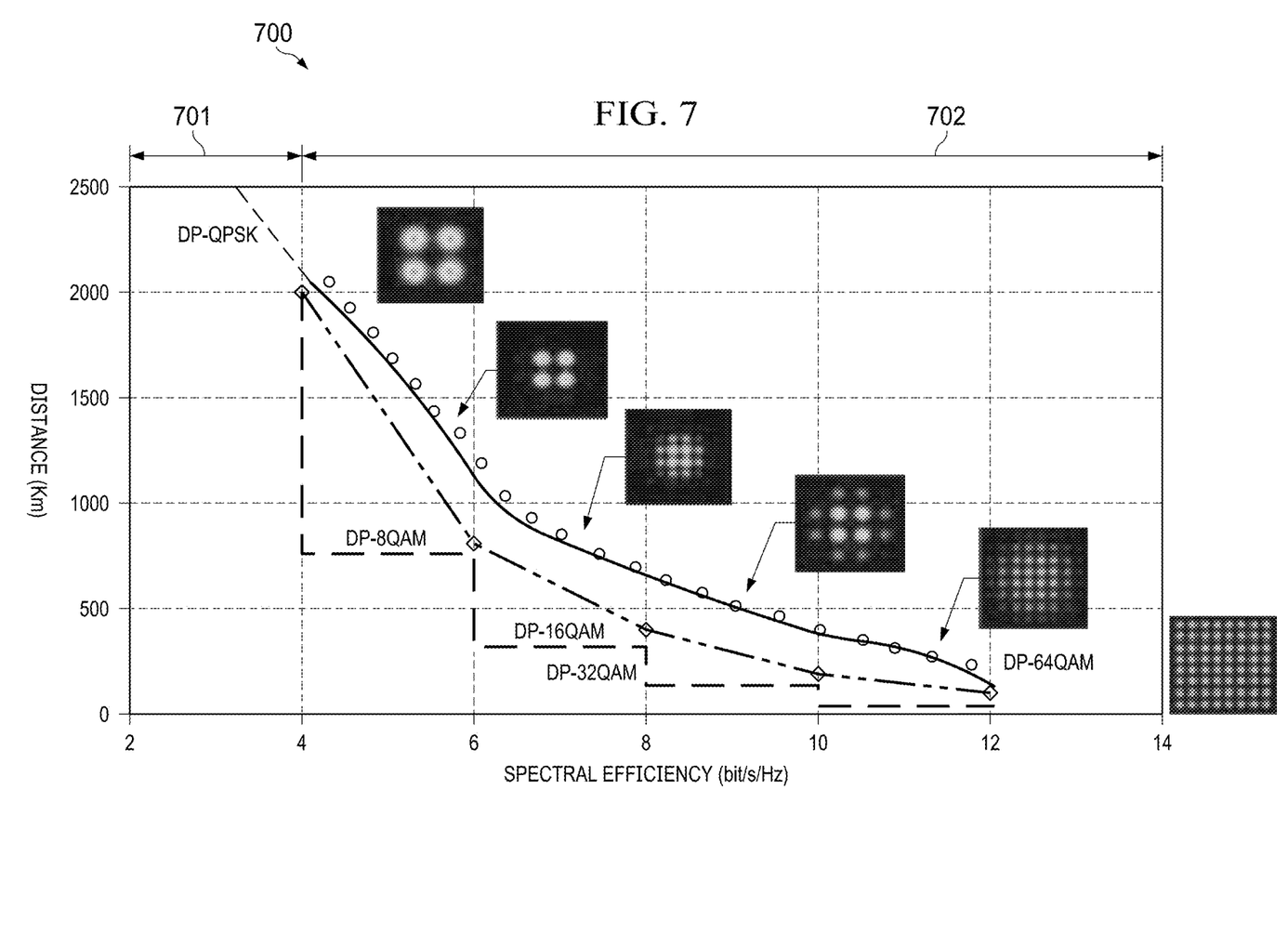
FIG. 7 illustrates a graph displaying spectral efficiency as a function of distance based on probabilistic shaping of an eight-dimensional super-symbol in an optical network.

FIG. 7 illustrates a graph 700 displaying spectral efficiency of dual-polarization signal as a function of distance based on probabilistic shaping in an optical network. Specifically, the graph 700 notes that spectral efficiencies above 2 bits per symbol per polarization for QAM are possible. Normal probabilistic shaping can allow entropies down to 2 bits per symbol per polarization. However, the eight-dimensional super-symbol with probabilistic shaping as described herein can facilitate entropy of 1.5 bits per symbol per polarization, and in some examples, 1 bit per symbol per polarization (e.g., region 701).

Figure 8:
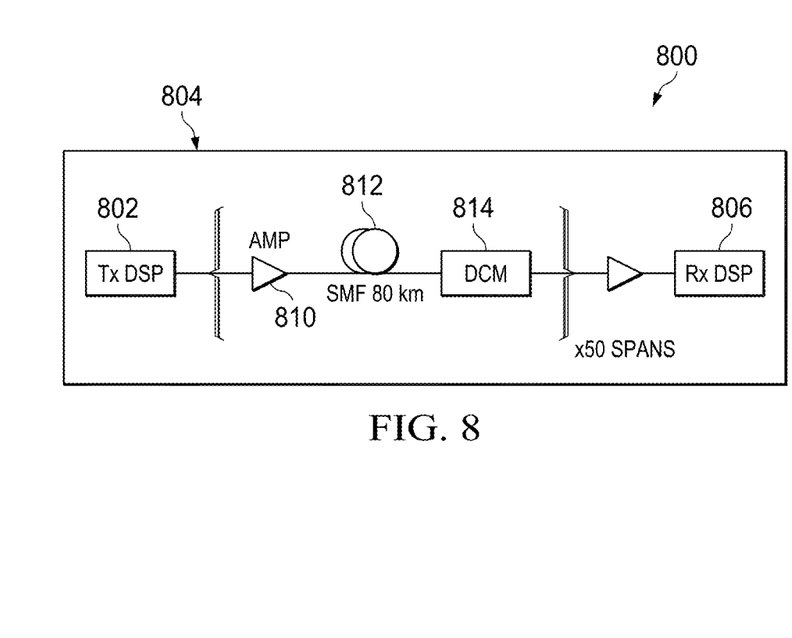
FIG. 8 illustrates a simulation diagram for probabilistic shaping of an eight-dimensional super-symbol.

FIG. 8 illustrates a simulation diagram 800 for probabilistic shaping of an eight-dimensional super-symbol. The simulation diagram 800 can include a simulated transmitter DSP 802, a simulated channel 804, and a simulated receiver DSP 806. In some examples, the channel 804 can multiple spans, e.g., 50 spans. The channel 804 can include an optical amplifier 810, optical fiber 812, and a dispersion-compensating module (DCM) 814. In some examples, the simulated transmitter DSP 802 can include such components as an upsampling component and a root-raised cosine filter component; the simulated channel 804 can include such components as a split-step Fourier method module; and the simulated receiver DSP 806 can include such components as a dispersion compensation component, a root-raised cosine filter component, a downsampling component, and a carrier phase recovery component.

To that end, the simulation parameters of the simulation diagram 800 can include a modulation format of eight-dimensional (8D)-PS-DP-16-QAM and time domain hybrid modulation (TDHM) (binary phase shift keying (BPSK) & quadrature phase shift keying (QPSK)), with a target entropy of 1.5 bits per symbol per polarization. The simulation parameters can further include a symbol rate of 32 Gigabaud, an eight-dimensional super-symbol for probabilistic shaping, one channel, a fiber input power of −4 decibel-milliwatts (dBm), a single-mode optical fiber (SMF) with 50 spans of 80 kilometers (total of 4000 kilometers), and a dispersion map of DCM-less (DCM 814 is not used).

Figure 10:
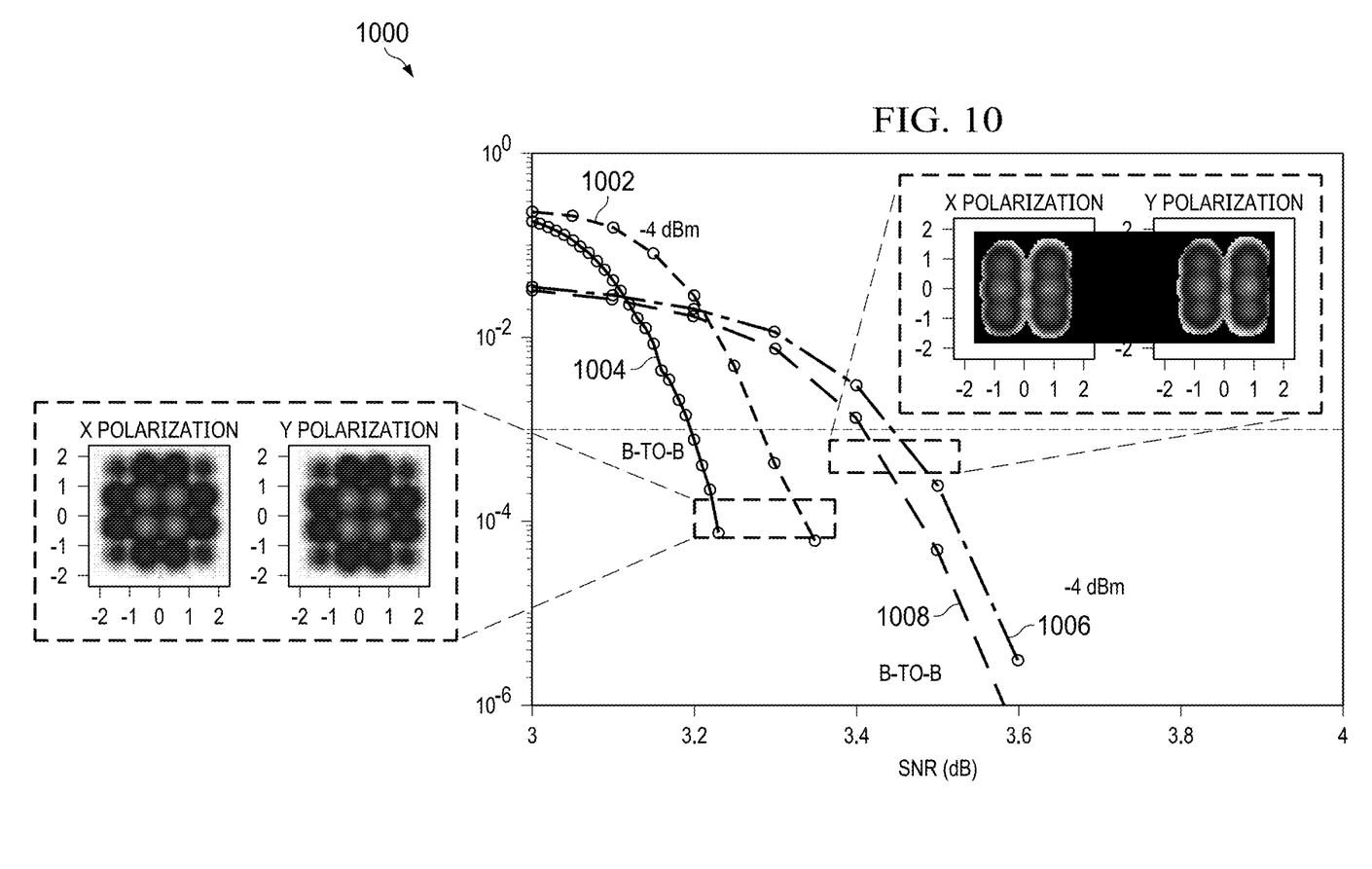
FIG. 10 illustrates a graph illustrating the SNR as a function of bit error rate (BER) based on probabilistic shaping of an eight-dimensional super-symbol.

FIG. 10 illustrates a graph 1000 illustrating the bit error rate (BER) versus SNR based on modulation formats, probabilistic shaping of an eight-dimensional super-symbol (8D-PS-DP-16-QAM) and time domain hybrid modulation format (TDHM). Specifically, the lines 1002, 1004 illustrate the SNR for 8D-PS-DP-16-QAM, with the line 1002 representing transmitted signal with launch power of −4 dBm, and the line 1004 representing back-to-back (B-to-B) performance. The lines 1006, 1008 illustrate the SNR for TDHM, with the line 1006 representing transmitted signal with launch power of −4 dBm, and the line 1008 representing back-to-back performance. As illustrated, the SNR performance is improved with 8D-PS-DP-16-QAM as compared with TDHM (i.e., line 1004 vs. line 1008 for signal in B-to-B configurations, and line 1002 vs. line 1006 for transmitted signal).

In some implementations, the system 400, and in particular, the log-likelihood decoder 458, can apply a log-likelihood ratio to the eight-dimensional super-symbol. Specifically, continuing the example above, each bit of the super-symbol sequence—e.g., 1111 1100 0100 1011—can have a distribution (e.g., Gaussian distribution) of noise. Thus, each bit can be associated with a probability (e.g., probability of being a 0 or 1). To that end, the probability can be determined and maximized. In particular, a certain bit sequence can be maximized to have a higher probability (e.g., as compared to a differing bit sequence), and this can be used to improve an accuracy of decoding of the super-symbol sequence (e.g., as a-priori information).

Specifically, the log-likely ratio decoder can be implemented for the eight-dimensional super-symbol. The log-likelihood ratio of each bit is used for by the decoder 418. In general, the likelihood probability for each bit can be expressed as:

$$L_i = \log \frac{q_i(y \mid 0)}{q_i(y \mid 1)} \quad \text{Equation (5)}$$

where y is channel output and $q_i$ (y|b) is the channel likelihood for each bit i.

For an additive white Gaussian noise (AWGN) channel, $q_i$ (y|b) is the channel likelihood for each bit i. For an AWGN channel with noise variance of $\sigma^2$:

$$q_i(y \mid b) = \sum_{s \in S_i = b} \frac{1}{\sqrt{2\pi\sigma^2}} e^{-\frac{(y-s)^2}{2\sigma^2}}. \quad \text{Equation (6)}$$

For a uniform QAM constellation, $L_i$ can be expressed as:

$$L_i = \log \left( \frac{\sum_{s \in S_i=0} e^{-\frac{1}{\sigma^2}((y_1-s_1)^2+(y_2-s_2)^2)}}{\sum_{s \in S_i=1} e^{-\frac{1}{\sigma^2}((y_1-s_1)^2+(y_2-s_2)^2)}} \right). \quad \text{Equation (7)}$$

Where, $s_1$ and $s_2$ are the real component and the imaginary component of a symbol s respectively. $S_i$ is the i-th bit of the binary labels of the complete set of possible constellation points. To that end, a log-likelihood ratio can be applied by the log-likelihood decoder 458 to the eight-dimensional super-symbol, shown by Equation (8):

$$L_i = \log \left( \frac{\sum_{s \in S_i=0} e^{-\frac{1}{\sigma^2}((y_1-s_1)^2+(y_2-s_2)^2+\ldots+(y_7-s_7)^2+(y_8-s_8)^2)}}{\sum_{s \in S_i=1} e^{-\frac{1}{\sigma^2}((y_1-s_1)^2+(y_2-s_2)^2+\ldots+(y_7-s_7)^2+(y_8-s_8)^2)}} \right). \quad \text{Equation (8)}$$

where $s_1$ to $s_8$ are defined per a look-up table. For example, $s_1$ and $s_2$ are the real part and imaginary part of a symbol $Sx_A$ (Table 1) in constellation diagram (FIG. 9) respectively. $S_i$ is the i-th bit label of symbol s. In the example with 8-dimensional modulation format based on 16QAM, the summation for $L_i$ is summed over all 256 possibilities of the symbols with $S_i$.

For a probabilistically shaped 8-dimensional modulation format, $L_i$ can be determined as by taking into account probabilities of each bit of each symbol:

$$L_i = \underbrace{\log \frac{P_{B_i}(0)}{P_{B_i}(1)}}_{a\text{-priori information}} + \underbrace{\log \frac{q_i(y \mid 0)}{q_i(y \mid 1)}}_{channel\ likelihood}, \quad \text{Equation (9)}$$

where $$P_{B_i}(b) = \sum_{s \in \{0,1\}^m : s_i = b} P_B(s) \text{ and}$$

$$q_i(y \mid b) = \sum_{s \in \{0,1\}^m : s_i = b} q_{awgn}(y \mid s) \frac{P_B(s)}{P_{B_i}(b)}. \quad \text{Equations (10, 11)}$$

Furthermore, as a result of the one-to-one relationship between the first four-dimensional symbol of period $T_A$ and the second four-dimensional symbol of period $T_B$, tie period $T_B$ carries the same probability as period $T_A$. Furthermore, the probability of the eight-dimensional super-symbol can be expressed as P(super-symbol)=P($T_A$)=P($T_B$). The log-likelihood decoder 458 can use the probabilities as given by the distribution matcher 404 for DP-16-QAM without extra modification.

Figure 11:
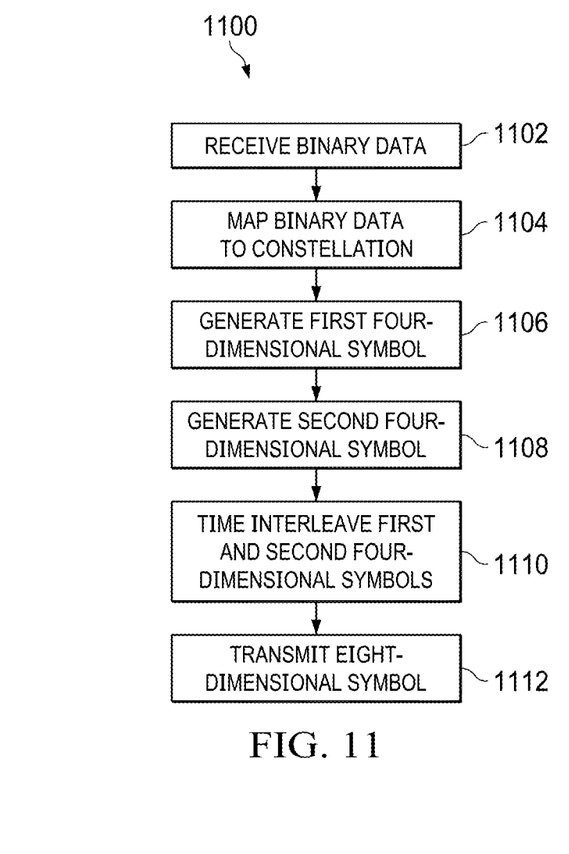
FIG. 11 illustrates a flowchart depicting selected elements of an embodiment of a method for probabilistic shaping of an eight-dimensional super-symbol in an optical network.

FIG. 11 illustrates a flowchart depicting selected elements of an embodiment of a method 1100 for probabilistic shaping of an eight-dimensional super-symbol in an optical network. The method 1100 may be performed by the network management system 300 and/or the optical transmission system 400 described herein with reference to FIGS. 1-10. It is noted that certain operations described in method 1100 may be optional or may be rearranged in different embodiments.

Method 1100 may begin at 1102 by receiving binary data that is to be transmitted as an optical signal. At 1104, at least a portion of the binary data is mapped to symbols of a M-QAM constellation (1104). At 1106, a first four-dimensional symbol of the M-QAM constellation is generated for a first symbol period. In some examples, probabilistic shaping is applied to the first four-dimensional symbol. At 1108, a second four-dimensional symbol of the M-QAM constellation is generated for a second symbol period. In some examples, the second symbol period is consecutive to the first symbol period. In some examples, the first and the second four-dimensional symbols have i) an equal symbol energy and ii) a one-to-one relationship. At 1110, the first symbol period and the second symbol period are time interleaved to generate an eight-dimensional super-symbol. At 1112, the eight-dimensional super-symbol is transmitted over the optical transport network The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method for probabilistic shaping of an eight-dimensional super-symbol in optical transport networks, the method comprising:
   receiving binary data to be transmitted as an optical signal;
   mapping at least a portion of the binary data to symbols of a M-QAM constellation;
   generating a first four-dimensional symbol of the M-QAM constellation for a first symbol period, including applying probabilistic shaping to the first four-dimensional symbol;
   generating a second four-dimensional symbol of the M-QAM constellation for a second symbol period, the second symbol period consecutive to the first symbol period, wherein the first and the second four-dimensional symbols have i) an equal symbol energy and ii) a one-to-one relationship;
   time interleaving the first symbol period and the second symbol period to generate an eight-dimensional super-symbol; and
   transmitting the eight-dimension super-symbol over the optical transport network.

2. The method of claim 1, wherein generating the second four-dimensional symbol comprises:
   identifying, via a look-up table (LUT), multiple four-dimensional symbols of the M-QAM constellation for the second symbol period, wherein each combination of the first four-dimensional symbol and each of identified multiple four-dimensional symbols have i) an equal symbol energy and iii) a one-to-one relationship; and
   identifying the second four-dimensional symbol from the multiple four-dimensional symbols based on a maximization of Euclidean distance of the eight-dimensional super-symbol.

3. The method of claim 2, wherein identifying the multiple four-dimensional symbols of the M-QAM constellation for the second symbol period further comprises:
   concatenating binary bits from the first four-dimensional symbol;
   converting the concatenation to a decimal super-symbol index;
   identifying a symbol index that corresponds to the decimal super-symbol index;
   converting symbols of the symbol index that correspond to the second four-dimensional symbol to binary bits; and
   interleaving the binary bits of the first and the second four-dimensional symbols.

4. The method of claim 1, wherein the second four-dimensional symbol included probabilistic shaping based on i) the one-to-one relationship between the first and the second four-dimensional symbol and ii) the probabilistic shaping of the first four-dimensional symbol.

5. The method of claim 1, wherein the probabilistic shaping is applied only to the first four-dimensional symbol.

6. The method of claim 1, further comprising applying a log-likelihood ratio to the eight-dimensional super-symbol.

7. A system for probabilistic shaping of an eight-dimension super-symbol in optical networks, the system comprising a processor having access to memory media storing instructions executable by the processor to:

receive binary data to be transmitted as an optical signal;

map at least a portion of the binary data to symbols of a M-QAM constellation;

generate a first four-dimensional symbol of the M-QAM constellation for a first symbol period, including applying probabilistic shaping to the first four-dimensional symbol;

generate a second four-dimensional symbol of the M-QAM constellation for a second symbol period, the second symbol period consecutive to the first symbol period, wherein the first and the second four-dimensional symbols have i) an equal symbol energy and ii) a one-to-one relationship;

time interleave the first symbol period and the second symbol period to generate an eight-dimensional super-symbol; and transmitting the eight-dimension super-symbol over the optical transport network.

8. The system of claim 7, wherein generating the second four-dimensional symbol comprises:

identifying, via a look-up table (LUT), multiple four-dimensional symbols of the M-QAM constellation for the second symbol period, wherein each combination of the first four-dimensional symbol and each of identified multiple four-dimensional symbols have i) an equal symbol energy and iii) a one-to-one relationship; and identifying the second four-dimensional symbol from the multiple four-dimensional symbols based on a maximization of Euclidean distance of the eight-dimensional super-symbol.

9. The system of claim 8, wherein identifying the multiple four-dimensional symbols of the M-QAM constellation for the second symbol period further comprises:

concatenating binary bits from the first four-dimensional symbol;

converting the concatenation to a decimal super-symbol index;

identifying a symbol index that corresponds to the decimal super-symbol index;

converting symbols of the symbol index that correspond to the second four-dimensional symbol to binary bits; and interleaving the binary bits of the first and the second four-dimensional symbols.

10. The system of claim 7, wherein probabilistic shaping is applied to the second four-dimensional symbol based on i) the one-to-one relationship between the first and the second four-dimensional symbol and ii) the probabilistic shaping of the first four-dimensional symbol.

11. The system of claim 7, wherein the probabilistic shaping is applied only to the first four-dimensional symbol.

12. The system of claim 7, the instructions further comprising applying a log-likelihood ratio to the eight-dimensional super-symbol.

* * * * *